(12) United States Patent
Fang et al.

(10) Patent No.: US 10,459,783 B2
(45) Date of Patent: Oct. 29, 2019

(54) LOW-LATENCY DECODER FOR REED SOLOMON CODES

(71) Applicant: Marvell World Trade Ltd., St. Michael (BB)

(72) Inventors: Jing Fang, San Jose, CA (US); Kok-Wui Cheong, Los Altos, CA (US)

(73) Assignee: Marvell World Trade Ltd., St. Michael (BB)

( * ) Notice: Subject to any disclaimer, the term of this patent is extended or adjusted under 35 U.S.C. 154(b) by 235 days.

(21) Appl. No.: 15/688,913

(22) Filed: Aug. 29, 2017

(65) Prior Publication Data
US 2018/0060160 A1    Mar. 1, 2018

Related U.S. Application Data

(60) Provisional application No. 62/381,169, filed on Aug. 30, 2016.

(51) Int. Cl.
| | |
|---|---|
| H03M 13/00 | (2006.01) |
| G06F 11/10 | (2006.01) |
| G06F 17/11 | (2006.01) |
| H03M 13/15 | (2006.01) |

(52) U.S. Cl.
CPC .............. *G06F 11/10* (2013.01); *G06F 17/11* (2013.01); *H03M 13/154* (2013.01); *H03M 13/1515* (2013.01); *H03M 13/1525* (2013.01); *H03M 13/1545* (2013.01); *G06F 2211/10* (2013.01)

(58) Field of Classification Search
CPC .... G06F 11/10; G06F 17/11; H03M 13/1515; H03M 13/1525
See application file for complete search history.

(56) References Cited

U.S. PATENT DOCUMENTS

| | | | | |
|---|---|---|---|---|
| 4,665,523 A | * | 5/1987 | Citron ..................... | G06F 7/724 714/785 |
| 6,154,868 A | * | 11/2000 | Cox .................. | H03M 13/1515 714/784 |
| 6,553,536 B1 | * | 4/2003 | Hassner ............ | H03M 13/1515 714/780 |

(Continued)

OTHER PUBLICATIONS

Reed et al., "Polynomial Codes over Certain Finite Fields", Journal of the Society for Industrial and Applied Mathematics, vol. 8, No. 2, pp. 300-304, Jun. 1960.

(Continued)

*Primary Examiner* — Esaw T Abraham

(57) ABSTRACT

A decoder includes a syndrome calculator, a Key Equation Solver (KES) and an error corrector. The syndrome calculator receives an n-symbol code word encoded using a Reed Solomon (RS) code to include (n−k) redundancy symbols, calculates for the code word 2t syndromes Si, t=(n−k)/2 is a maximal number of correctable erroneous symbols. The KES derives an error locator polynomial ˆ(x) whose roots identify locations of erroneous symbols, by applying to the syndromes a number of t iterations. In each iteration the KES calculates two discrepancies between ˆ(x) and respective two candidates of ˆ(x), and derives from the two candidates an updated candidate of ˆ(x). The error corrector recovers the code word by correcting the erroneous symbols using the derived error locator polynomial ˆ(x).

20 Claims, 3 Drawing Sheets

(56) References Cited

U.S. PATENT DOCUMENTS

| | | | | |
|---|---|---|---|---|
| 6,990,624 B2* | 1/2006 | Dohmen | ............ | H03M 13/1535 |
| | | | | 714/782 |
| 7,509,564 B2* | 3/2009 | Dohmen | ............ | H03M 13/1535 |
| | | | | 714/757 |
| 8,464,141 B2* | 6/2013 | Pilsl | ................. | H03M 13/152 |
| | | | | 714/782 |
| 9,069,692 B2* | 6/2015 | Chu | ................. | H03M 13/152 |
| 9,246,515 B2* | 1/2016 | Kong | ............. | H03M 13/1515 |
| 9,906,240 B2* | 2/2018 | Lin | ................. | H03M 13/152 |
| 10,230,399 B2* | 3/2019 | Langhammer | .... | H03M 13/1525 |

OTHER PUBLICATIONS

Massey et al., "Shift-Register Synthesis and BCH decoding", IEEE Transactions on Information Theory, vol. 15, Issue 1, pp. 122-127, Jan. 1969.

Chien.,"Cyclic Decoding Procedures for the Bose-Chaudhuri-Hocquenghem Codes", IEEE Transactions on Information Theory, IT-10, No. 4, pp. 357-363, Oct. 1964.

Forney., "Decoding BCH Codes", IEEE Transactions on Information Theory, vol. 11, No. 4, pp. 549-557, 1965.

* cited by examiner

LOW-LATENCY DECODER FOR REED SOLOMON CODES

CROSS-REFERENCE TO RELATED APPLICATIONS

This application claims the benefit of U.S. Provisional Patent Application 62/381,169, filed Aug. 30, 2016, whose disclosure is incorporated herein by reference.

FIELD OF THE DISCLOSURE

The present disclosure relates generally to Forward Error Correction (FEC) codes, and particularly to methods and systems for low-latency decoding of Reed Solomon codes.

BACKGROUND

In various applications such as in communication and storage systems, data is protected using Forward Error Correction (FEC) codes. To protect a data message using a FEC code, e.g., a Reed Solomon code, the encoder typically adds to the data message redundancy information before sending the message to the destination, e.g., over some channel. At the receiver, a decoder uses the redundancy information for detecting and correcting errors that the channel may have caused while the sent message.

The description above is presented as a general overview of related art in this field and should not be construed as an admission that any of the information it contains constitutes prior art against the present patent application.

SUMMARY

An embodiment that is described herein provides a decoder that includes a syndrome calculator, a Key Equation Solver (KES) and an error corrector. The syndrome calculator is configured to receive an n-symbol code word encoded using a Reed Solomon (RS) code to include (n−k) redundancy symbols, and to calculate for the code word 2t syndromes $S_i$, t=(n−k)/2 is a maximal number of correctable erroneous symbols. The KES is configured to derive an error locator polynomial $\Lambda(x)$ whose roots identify locations of erroneous symbols, by applying to the syndromes a number of t iterations. In a single iteration of the t iterations the KES is configured to calculate two discrepancies between $\Lambda(x)$ and respective two candidates of $\Lambda(x)$, and to derive from the two candidates an updated candidate of $\Lambda(x)$. The error corrector is configured to recover the code word by correcting the erroneous symbols using the derived error locator polynomial $\Lambda(x)$.

In some embodiments, the KES is configured to represent candidates of $\Lambda(x)$ using a coefficient vector $\lambda$, and to derive updated candidates of $\Lambda(x)$ by re-calculating $\lambda$ a total number of t times over the t iterations. In other embodiments, the KES is configured to derive the updated candidate of $\Lambda(x)$ so that the first and second discrepancies calculated based on the updated candidate are eliminated. In yet other embodiments, the KES is configured to define, in an $i^{th}$ iteration, a first syndrome vector $S(2i)$ and a second syndrome vector $S(2i+1)$, wherein $S(i)=[S_i, S_{i-1}, \ldots, S_{i-t}]$, and to calculate the first and second discrepancies using the first and second syndrome vectors, respectively.

In an embodiment, the KES is configured to calculate the first discrepancy as $\delta=S(2i)'\lambda$ and to calculate the second discrepancy as $\delta 1=S(2i+1)'\lambda 1$, wherein $\lambda$ and $\lambda 1$ are coefficient vectors representing respective candidates of $\Lambda(x)$ corresponding to $S(2i)$ and $S(2i+1)$, respectively. In another embodiment, the KES is configured to calculate the first discrepancy as $\delta=S(2i)'\lambda$, to calculate, in parallel to the first discrepancy, first and second intermediate results $\delta 11$ and $\delta 12$, based at least on $S(2i+1)$, and to calculate the second discrepancy using $\delta 11$ and $\delta 12$. In yet another embodiment, the KES is configured to store in each of the t iterations a shifted-by-one coefficient vector $b_{SR}$ and a shifted-by-two coefficient vector $b_{SR2}$ derived by shifting a coefficient vector corresponding to a candidate of $\Lambda(x)$ one position and two position respectively, and to derive an updated candidate of $\Lambda(x)$ in a subsequent iteration based at least on one of $b_{SR}$ and $b_{SR2}$.

In some embodiments, the KES includes three updating modules available for deriving the updated candidate of $\Lambda(x)$, and the KES is configured to derive the updated candidate of $\Lambda(x)$ using one of the three updating modules. In other embodiments, the KES is configured to select one of the three updating modules using a three-way decision operation that depends on $\delta$ and $\delta 1$, and then to calculate the updated candidate of $\Lambda(x)$, using the selected updating module. In yet other embodiments, the KES is configured to calculate three candidates of $\Lambda(x)$ using the three updating modules, in parallel, and then to select one of the three candidates of $\Lambda(x)$ using a three-way decision operation that depends on $\delta$ and $\delta 1$.

In an embodiment, the KES is configured to select one of the three updating modules in response to detecting that a first condition that depends on $\delta$ is true, and otherwise to calculate two updated candidates of $\Lambda(x)$ using remaining two updating modules, and selecting one of the two candidates of $\Lambda(x)$ by checking a second condition that depends on $\delta 1$.

There is additionally provided, in accordance with an embodiment that is described herein, a method for decoding, including, receiving for decoding by a decoder an n-symbol code word that was encoded using a Reed Solomon (RS) code. A number of 2t syndromes $S_i$, i=0 ... 2t−1 is calculated for the received code word, wherein t=(n−k)/2 a maximal number of erroneous symbols that the RS code is designed to correct, and (n−k) is a number of redundancy symbols in the code word. An error locator polynomial $\Lambda(x)$ whose roots identify locations of erroneous symbols in the received code word is derived for the received code word, by a Key Equation Solver (KES), by applying to the syndromes a number of t iterations. In a single iteration of the t iterations first and second discrepancies between $\Lambda(x)$ and respective first and second candidates of $\Lambda(x)$ are calculated by the KES, and an updated candidate of $\Lambda(x)$ is derived from at least one of the first and second candidates. An error-free version of the code word is derived by correcting the erroneous symbols using the derived error locator polynomial $\Lambda(x)$.

The present disclosure will be more fully understood from the following detailed description of the embodiments thereof, taken together with the drawings in which:

DETAILED DESCRIPTION OF EMBODIMENTS

Figure 1:
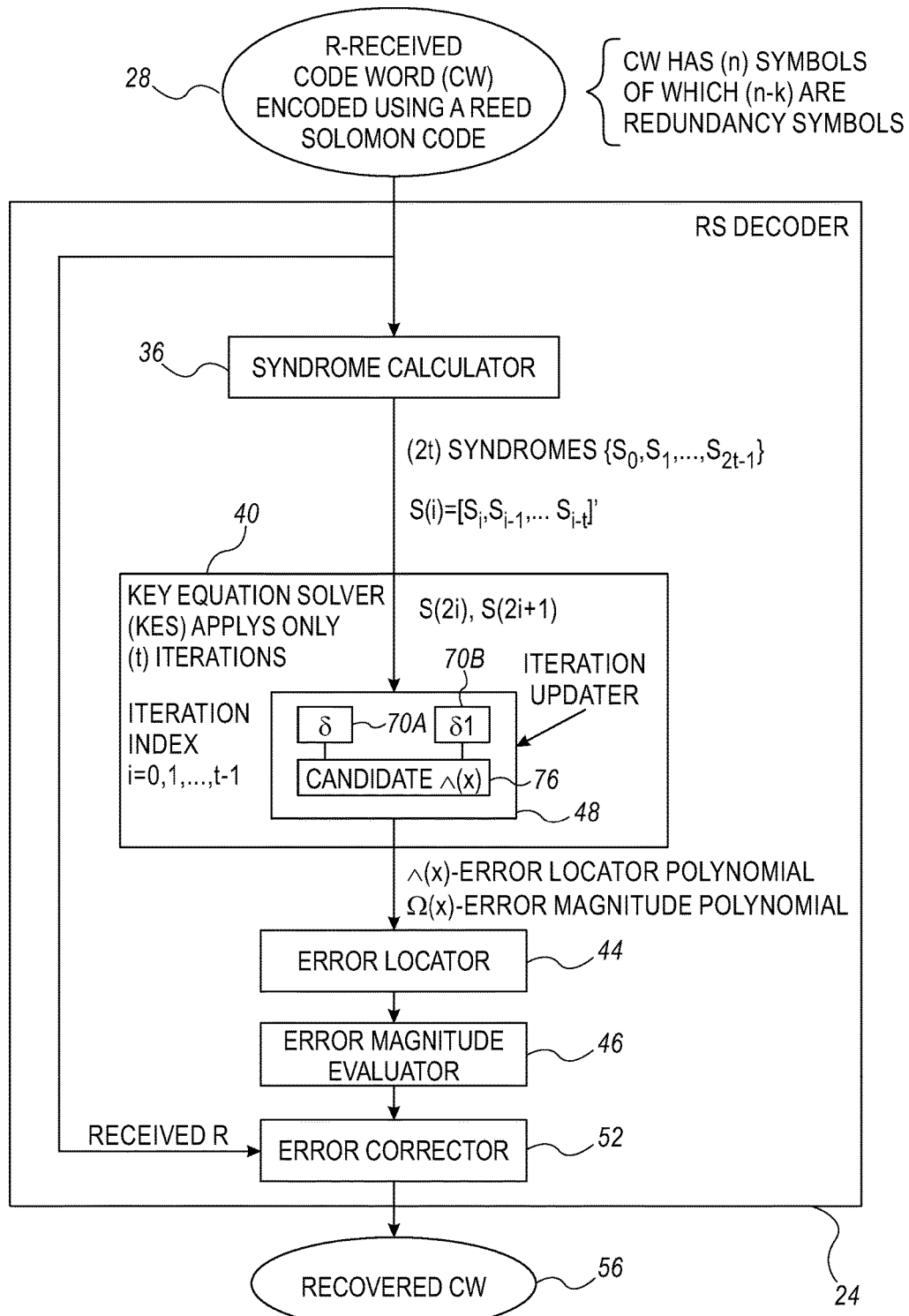
FIG. 1 is a block diagram that schematically illustrates a decoder for a Reed Solomon (RS) code, in accordance with an embodiment that is described herein.

A Reed Solomon (RS) code denoted RS (n, k) is a block code that maps a message of k data symbols into a code word of n symbols by adding to the message a number of (n−k) redundancy symbols. A RS(n, k) code is capable of correcting up to t erroneous symbols, wherein t=(n−k)/2 for even-valued (n−k) and t=(n−k−1)/2 for odd-valued (n−k).

Embodiments that are described herein provide improved methods and systems for low-latency decoding or RS codes. The RS code, is described, for example, in "Polynomial Codes over Certain Finite Fields," Journal of the Society for Industrial and Applied Mathematics, Volume 8, pages 300-304, 1960, which is incorporated herein by reference.

A RS decoder is typically required to determine a polynomial $\Lambda(x)$ that is indicative of the locations of the erroneous symbols in the code word. Conventionally, the decoder determines $\Lambda(x)$ using a hardware module that generates 2t candidate polynomials in 2t respective iterations. In the disclosed embodiments, however, the configuration of this hardware module has been changed so as to determine $\Lambda(x)$ by generating only t candidate polynomials in respective t iterations. Moreover, in an embodiment, the RS decoder executes some operations in parallel, each of the t iterations. Embodiments for determining $\Lambda(x)$ are described in detail below.

In the description that follows we refer mainly to RS codes that are defined over a finite field referred to as a Galois Field (GF) of the form $GF(2^m)$, which contains $N=2^m-1$ elements $\{0, 1, \alpha, \alpha^2, \ldots, \alpha^{N-1}\}$, wherein a is a primitive element of $GF(2^m)$. Each element of $(GF(2^m))$ can be represented by an m-bit binary number. The disclosed techniques are similarly applicable to RS codes based on of finite fields.

A RS code is constructed by a generator polynomial g(x) whose roots are (n−k)=2t consecutive elements of the underlying GF, as given, for example by:

$$g(x)=(x-\alpha^0)(x-\alpha^1)\ldots(x-\alpha^{2t-1})=g_0+g_1x+\ldots+g_{n-k}x^{n-k} \quad \text{Equation 1}$$

In generating a code word of the RS code, the message to be encoded can interpreted as coefficients of a corresponding message polynomial M(x). The RS encoder typically multiplies N (x) by $x^{n-k}$ to make room for (n−k) redundancy symbols, and divides the product $[M(x) \cdot x^{n-k}]$ by the generating polynomial g(x), which results in a quotient q(x) and a remainder r(X). The code word (CW) corresponding to the message is represented by the polynomial CW(x) given by:

$$CW(x)=M(x) \cdot x^{n-k}+r(x)=g(x) \cdot q(x) \quad \text{Equation 2}$$

At the receiver side, one or more of the symbols of the code word may be erroneous, e.g., due to noise and distortion caused by the channel. The effect of the channel is sometimes modeled by an error polynomial E(x) added to the code word polynomial, i.e., the received code word is represented by a polynomial R(x) given by:

$$R(x)=CW(x)+E(x) \quad \text{Equation 3}$$

The values of the polynomial R(x) at the roots $\alpha^i$ of the generator polynomial g(x) are the syndromes of the code word denoted $S_i$. Since the code word polynomial CW(x) is zeroed at the roots of g(x), the syndromes depend only on the error pattern as seen in Equation 4:

$$S_i=R(\alpha^i)=CW(\alpha^i)+E(\alpha^i)=E(\alpha^i), i=0,1 \ldots 2t-1 \quad \text{Equation 4}$$

Let 'e' denote the number of the erroneous symbols in the received code word, wherein e≤t. The error polynomial E(x) can be written as:

$$E(x) = \sum_{k=1}^{e} E_{i_k} x^{i_k} \quad \text{Equation 5}$$

In Equation 5, the index $i_k$ (in the range 0 . . . n−1) denotes the location of the $k^{th}$ erroneous symbol, and $E_{i_k}$ denotes the respective error value. By defining the error locators $X_k = \alpha^{i_k}$ and the error values $Y_k = E_{i_k}$, the syndromes can be expressed as:

$$S_i = \sum_{k=1}^{e} X_k^i \cdot Y_k, i = 0 \ldots 2t-1 \quad \text{Equation 6}$$

To correct the erroneous symbols in the received code word, the decoder is required to find the number of erroneous symbols, in which of the code word symbols these errors occur $(X_k)$, and the respective error values $(Y_k)$. The error locators $X_k$, k=1 . . . e, can be used for defining an error locator polynomial $\Lambda(x)$ given by:

$$\Lambda(x) = \prod_{k=1}^{e} (1 + X_k x) = \lambda_0 + \lambda_1 x + \lambda_2 x^2 + \ldots + \lambda_e x^e \quad \text{Equation 7}$$

Note that the degree of $\Lambda(x)$ equals the number of erroneous symbols in the received code word, and the reciprocals of the roots of $\Lambda(x)$ are the error locators $X_k$ of the erroneous symbols. The syndromes $S_i$ and the error locator polynomial $\Lambda(x)$ are related via the following set of (2t−e) equations:

$$\lambda_0 S_{i+e} + \lambda_1 S_{i+e-1} + \ldots + \lambda_{e-1} S_{i+1} + \lambda_e S_i = 0, i=0 \ldots 2t-1 \quad \text{Equation 8:}$$

Equation 8 is also referred to as the "key equation" and a method for solving Equation 8 having unknown variables $\lambda_0 \ldots \lambda_e$, wherein the number of errors 'e' is unknown is also referred to as a "Key Equation Solver" (KES). In some embodiments, given the 2t syndromes $S_i$, i=0 . . . 2t−1, the goal of the KES is to find an error locator polynomial $\Lambda(x)$ that satisfies Equation 8 for all i=0 . . . 2t−1.

A RS decoder can evaluate the error locator polynomial $\Lambda(x)$, for example, using the Berlekamp-Massey's method, which is described, for example, in "Shift-Register Synthesis and BCH decoding," IEEE Transactions on Information Theory, Volume 15, Issue 1, January 1969, pages 122-127, which incorporated herein by reference.

In some embodiments, the RS decoder decodes the code word from R(x) by performing the following main operations:

Calculate from the polynomial R(x) of the received code word a number of 2t=(n−k) syndromes $S_i$, e.g., using Equation 4.

Solve Equation 8 to find the error locator polynomial $\Lambda(x)$. The roots of $\Lambda(x)$ identify locations of erroneous symbols in the received code word. Embodiments that evaluate $\Lambda(x)$ efficiently are described in detail below.

Derive the locations of the erroneous symbols by finding the roots of $\Lambda(x)$. In an embodiment, the decoder performs this operation using the Chien's search method, or using any other suitable method. The Chien's search method is described, for example, in "Cyclic Decoding Procedures for the Bose-Chaudhuri-Hocquenqhem Codes," IEEE Transactions on Information Theory, IT-10, No. 4, pages 357-363, 1964, which is incorporated herein by reference.

Derive the error values corresponding to the erroneous symbols. In an embodiment, the decoder carries out this operation using the Forney method, or any other suitable method. The Forney method is described, for example, in "On Decoding BCH Codes," IEEE Transactions on Information Theory, Volume 11, No. 4, pages 549-557, 1965, which is incorporated herein by reference.

Recover the code word CW by correcting the erroneous symbols in the received code word.

In some embodiments, the KES derives the error locator polynomial $\Lambda(x)$ by applying to the syndromes only t iterations. In each of the t iterations, the KES calculates first and second discrepancies between $\Lambda(x)$ and respective first and second candidates of $\Lambda(x)$, and derives, from at least one of the first and second candidates, an updated candidate of $\Lambda(x)$. In some embodiments, calculating the first and second discrepancy values and/or deriving a candidate polynomial of $\Lambda(x)$, in each of the iterations, involves calculating and/or updating certain intermediate terms in parallel, which reduces latency compared to conventional implementations.

For example, in one embodiment, the KES calculates the first discrepancy value, as well as two intermediate terms that are required for calculating the second discrepancy value, in parallel, using three respective hardware modules. This is different from conventional implementations in which one hardware module calculates each of the first and second discrepancy values in different iterations. In an embodiment, the KES derives the updated candidate of $\Lambda(x)$ so that the first and second discrepancies calculated based on the updated candidate are eliminated.

In some embodiments, the KES defines, in the $i^{th}$ iteration (i=0 . . . t−1), a first syndrome vector denoted S(2i) and a second syndrome vector denoted S(2i+1), wherein S(i)=[Si, Si−1, . . . , Si−t], and calculates the first and second discrepancies using S(2i) and S(2i+1), respectively. In an embodiment, the KES calculates the first discrepancy as $\delta=S(2i)'\lambda$ and the second discrepancy as $\delta 1=S(2i+1)'\lambda 1$, wherein $\lambda$ and $\lambda 1$ are coefficient vectors representing respective candidates of $\lambda(x)$ corresponding to S(2i) and S(2i+1), respectively.

In the disclosed techniques, the KES evaluates the error locator polynomial by applying to the syndromes only t iterations, over which the KES derives a candidate error locator polynomial only a total number of t times, with the addition of only small hardware footprint compared to conventional implementations. Moreover, unlike conventional implementations, in each of the t iterations, the KES calculates some intermediate terms in parallel. Using this approach the KES solves the key equation significantly faster than a conventional approach in which deriving the error locator polynomial requires 2t iterations and deriving a candidate error locator polynomial a total number of 2t times. By using the disclosed techniques, the latency of the RS decoding is reduced t iterations, while the design timing constraint and the decoder power consumption are kept low.

Next, we describe the structure of an example RS decoder embodiment.

FIG. 1 is a block diagram that schematically illustrates a decoder 24 for a Reed Solomon (RS) code, in accordance with an embodiment that is described herein. In the example of FIG. 1, decoder 24 is implemented in hardware. Decoder 24 accepts an input code word R 28 comprising a code word (CW) that was encoded using a RS (n, k) code. The code word comprises a total number of n symbols, of which k symbols are data symbols and (n−k) symbols are redundancy symbols, in an embodiment.

Decoder 24 is suitable for use in various applications such as, for example, in a receiver of a communication system, in retrieving data in a storage system, or in any application in which data is protected using a RS code.

Decoder 24 comprises, in an embodiment, a syndrome calculator 36, a Key Equation Solver (KES) 40, an error locator 44, an error magnitude evaluator 46 and an error corrector 52. Syndrome calculator 36 receives input code ward R, and calculates 2t syndromes $S_i$ as given in Equation 4.

In some embodiments, based on the syndromes, KES 40 derives the error locator polynomial $\Lambda(x)$ in an iterative manner. In conventional implementations, evaluating $\Lambda(x)$ requires to apply to the syndromes 2t iterations. In such implementations, in each of the 2t iterations a conventional KES would (i) calculate a discrepancy of the current candidate of $\Lambda(x)$ relative to the correct value, and (ii) update the candidate of $\Lambda(x)$ to eliminate the discrepancy. Note that in this conventional approach, the KES calculates a total number of 2t discrepancy values and derives a total number of 2t candidate error locator polynomials.

Unlike the conventional approach, in some disclosed embodiments, KES 40 applies to the syndromes a number of only t iterations, wherein in each of these t iterations the KES calculates two discrepancy values (also referred to herein as error factors), and derives an updated candidate of the error locator polynomial, based on the two discrepancy values, only once per iteration. In such embodiments, in solving Equation 8, the KES derives a total number of only t candidates for the error locator polynomial, wherein calculating each candidate is based on two discrepancy values (compared to 2t candidates in the conventional approach). In addition, in some embodiments, the KES executes some of the operations for calculating the two discrepancy values in parallel, to reduce latency.

In an embodiment, KES 40 comprises an iteration updater 48 that receives, in each of the t iterations, two syndrome vectors denoted S(2i) and S(2i+1), each such vector comprises (t+1) consecutive syndromes of the form:

$$S(i)=[S_i, S_{i-1}, S_{i-2}, \ldots, S_{i-t}]' \qquad \text{Equation 9:}$$

In an embodiment, the two syndrome vectors S(2i) and S(2i+1) are generated from a single copy of the 2t syndromes, which are stored in a shared hardware. In Equation 9, elements of S(i) for which the index is out of range get a zero value. In each iteration, iteration updater 48 calculates first and second discrepancy values 70A and 70B (denoted respectively $\delta$ and $\delta 1$) based respectively on S(2i) and S(2i+1), and derives an updated candidate 76 of polynomial $\Lambda(x)$ based on the first and second discrepancy values as will be described in detail below. In response to terminating the t iterations, KES 40 outputs the final error locator polynomial $\Lambda(x)$, which equals the same locator polynomial that would have result by using conventional methods. In some embodiments, KES 40 additionally outputs polynomial $\Omega(x)$ that uses for evaluating the magnitudes of the errors.

In an embodiment, KFS 40 provides the error locator polynomial $\Lambda(x)$ to error locator 44, which locates the erroneous symbols based on $\Lambda(x)$, e.g., using Chien's and Forney methods (mentioned above), and provides polynomial $\Omega(x)$ to error magnitude evaluator 46, which evaluates the magnitude of the located, e.g., using the Forney method mentioned above), and corrects the erroneous symbols to produce a recovered CW 56 by calculating:

$$CW(x)=R(x)+E(x) \qquad \text{Equation 10:}$$

In Equation 10, E(x) is an error location polynomial, which the decoder derives, based on the results of the error locator and the error magnitude evaluator.

In some embodiments, some or all of the elements of decoder 24 of FIG. 1 are implemented in hardware, such as using one or more Field-Programmable Gate Arrays (FPGAs) or Application-Specific Integrated Circuits (ASICs). In an alternative embodiment, certain elements of the decoder, such as one or more of syndrome calculator 36, KFS 40 and error corrector 52 are implemented in a programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The decoder configuration in FIG. 1 is an example decoder configuration, which is depicted solely for the sake of clarity. In alternative embodiments, any other suitable decoder configuration can be used. Elements of the decoder that are not mandatory for understanding the disclosed techniques have been omitted from the figure for the sake of clarity.

Figure 2:
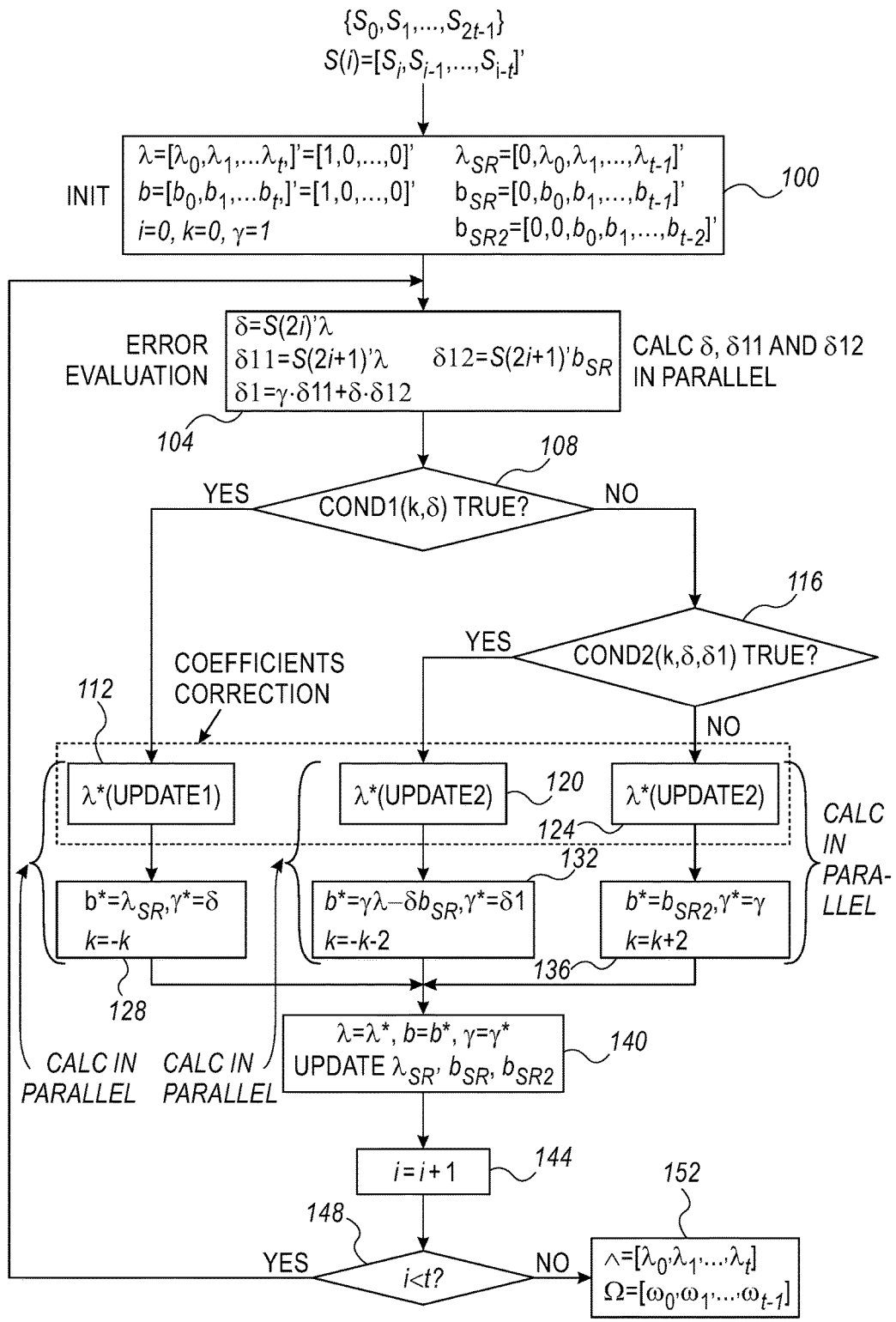
FIGS. 2 and 3 are flow charts that schematically illustrate methods for evaluating an error locator polynomial for decoding a code word generated by a RS code, in accordance with embodiments that are described herein.
Figure 3:
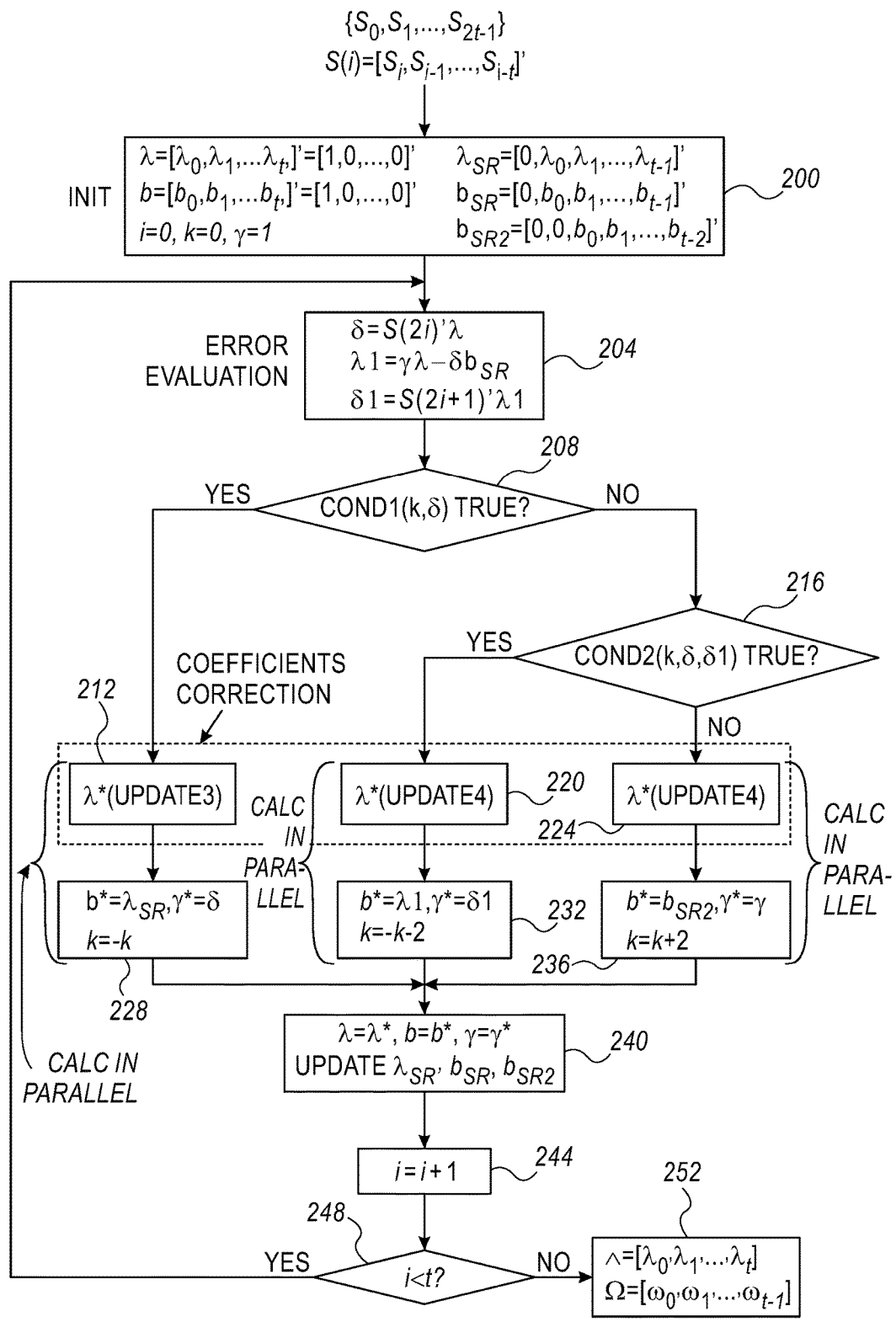

FIGS. 2 and 3 are flow charts that schematically illustrate methods for evaluating an error locator polynomial for decoding a code word generated by a RS code, in accordance with embodiments that are described herein. The methods in FIGS. 2 and 3 will be described as executed by KES 40 of RS decoder 24.

The method of FIG. 2 begins with KES 40 receiving syndromes $\{S_0, S_1, \ldots, S_{2t-1}\}$ from syndrome calculator 36, at an initialization operation 100. In addition, at operation 100, KES 40 receives (or alternatively generates internally) vectors S(i) as given in Equation 9 above.

Further at operation 100, the KES initializes various parameters as follows:

- $\lambda=[\lambda_0, \lambda_1, \ldots, \lambda_t]'=[1, 0, \ldots 0]'$—a coefficient vector representing a candidate of the error locator polynomial $\Lambda(x)$.
- $b=[b_0, b_1, \ldots b_t]'=[1, 0, \ldots, 0]'$—a coefficient vector representing a correction polynomial.
- $\lambda_{SR}=[0, \lambda_0, \lambda_1, \ldots, \lambda_{t-1}]'$—a shifted-by-one version of vector $\lambda$.
- $b_{SR2}=[0, b_0, b_1, \ldots b_{t-1}]'$—a shifted-by-one version of vector b.
- $b_{SR2}=[0, 0, b_0, b_1, \ldots, b_{t-2}]'$—a shifted-by-two version of vector b.
- i=0—an iteration index, in the range 0 ... t-1.
- k=0—a control parameter that together with the discrepancy values controls the KES behavior in each iteration.
- $\gamma=1$—a normalization factor that depends on the discrepancy values.

At an error evaluation operation 104, the KES calculates first and second discrepancy values denoted $\delta$ and $\delta 1$, respectively. The first discrepancy value $\delta$ is related to vector S(2i) and to $\lambda$, whereas the second discrepancy value $\delta 1$ is related to vector S(2i+1), $\lambda$, $\gamma$, b and the first discrepancy $\delta$. In an embodiment, by using the expressions $\delta 11=S(2i+1)'\lambda$ and $\delta 12=S(2i+1)'b_{SR}$, the values $\delta$, $\delta 11$ and $\delta 12$ are calculated independently in parallel (simultaneously) to reduce latency. The KES therefore calculates the value $\delta 1$ based on $\gamma$ and on the values $\delta$, $\delta 11$ and $\delta 12$ that were calculated in parallel.

At a first testing operation 108, the KES evaluates a first condition given by:

$$\text{COND1}(k,\delta)=(k\geq 0)\&(\delta\neq 0) \qquad \text{Equation 11:}$$

If at operation 108 COND1 is false, the KES proceeds to a second testing operation 116, at which the KES evaluates a second condition given by:

$$\text{COND2}(k,\delta,\delta 1)=[(k\geq 0)\&(\delta==0)\&(\delta 1\neq 0)]|[(k==1)\&(\delta 1\neq 0)] \qquad \text{Equation 12:}$$

The conditions tested in operations 108 and 116 can be viewed as a three-way decision making operation, directed to executing one of two methods denoted UPDATE1 and UPDATE2, for deriving an updated candidate of $\Lambda(x)$. Table 1 summarizes the decision making process.

TABLE 1

Three-way decision making for updating coefficient vector

| Condition | COND1 (Operation 108) | | COND2 (Operation 116) | |
| --- | --- | --- | --- | --- |
| Result | True | False | True | False |
| Execute | UPDATE1 operations 112 and 128 | TEST COND2 | UPDATE2 operations 120 and 132 | UPDATE2 operations 124 and 136 |

At operation 112 the KES executes method UPDATE1 by calculating the expression:

$$\lambda^*=(\gamma\delta)\lambda-(\delta^2)b_{SR}-\delta 1\lambda_{SR} \qquad \text{Equation 13:}$$

At each of operations 120 and 124 the KES executes the updating method denoted UPDATE2 given by the expression:

$$\lambda^*=\gamma\lambda-\delta 1 b_{SR2} \qquad \text{Equation 14:}$$

The updating operations in Equations 13 and 14 are designed to derive an updated candidate of the error locator polynominal, so as to eliminate the first and second discrepancy values (calculated based on the updated candidate).

After (or in parallel to) calculating the temporary coefficient vector $\lambda^*$, which represents the updated candidate of $\Lambda(x)$, using one of operations 112, 120 or 124, the KES executes a respective parameter updating operation 128, 132 or 136 for updating the parameters b, $\gamma$, and k. Table 2 summarizes these parameter updating operations. In some embodiments, the KES executes each pair of operations (112 and 128), (120 and 132) and (124 and 136) in parallel. In such embodiments, the KES updates the values $\lambda^*$, $b^*$, $\gamma^*$ and the parameter k independently in parallel (simultaneously).

| parameter | Operation 128 | Operation 132 | Operation 136 |
| --- | --- | --- | --- |
| b | $b^* = \lambda_{SR}$ | $b^* = \gamma\lambda - \delta b_{SR}$ | $b^* = b_{SR2}$ |
| $\gamma$ | $\gamma^* = \delta$ | $\gamma^* = \delta 1$ | $\gamma^* = \gamma$ |
| k | $k = -k$ | $k = -k - 2$ | $k = k + 2$ |

At operations 128, 132 and 136, the KES updates b*, γ* and the parameter k as depicted in Table 2. At a preparation for next iteration operation 140, the KES updates parameters λ, b and γ to the values of the temporary parameters calculated by operation pairs (112 and 128), (120 and 132) or (124 and 136). In addition, at operation 140 the KES updates the shifted-by-one coefficient vector $\lambda_{SR}$, and the shifted-by-one vector $b_{SR}$ and shifted-by-two vector $b_{SR2}$.

In the context of the present disclosure and in the claims, an updating operation 112, 120 and 124 is implemented using a respective updating module (implemented in hardware). Alternatively, three updating modules implement respective pair of operations (112 and 128), (120 and 132) or (124 and 136).

In some embodiments, the KES makes a three-way decision (comprising COND1 and COND2) for selecting one of the three updating modules to execute for deriving the candidate of $\Lambda(x)$. Alternatively, the KES executes each of the three updating modules to calculate three respective candidates of $\Lambda(x)$, and makes the three-way decision to select one of the calculated candidates.

In yet other embodiments, the KES selects one of the three updating modules in response to detecting that a COND1 is true, and otherwise calculates two updated candidates of $\Lambda(x)$ using the remaining two updating modules, and selects one of the two candidates of $\Lambda(x)$ by checking COND2.

Next, the KES increments the iteration index at an iteration counting operation 144. At a loop testing operation 148, the KES checks whether the number of iterations already executed is less than t, and if so, loops back to operation 104 to carry out the next iteration. Otherwise, the KES has already executed a number of t iterations, and outputs the final coefficient vector representing the error locator polynomial $\Lambda(x)$ corresponding to the input code word R, at an output operation 152. Following operation 152 the method terminates.

In some embodiments, at operation 152, KES 40 additionally outputs an error magnitude polynomial denoted $\Omega(x)$ whose coefficients are given by a vector [$\omega_0, \omega_1, \ldots, \omega_{t-1}$]. In some embodiments, the polynomial $\Omega(x)$ in used by error magnitude evaluator 46 to determine the error values. In an embodiment, KES 40 derives $\Omega(x)$ by solving a variant of the key equation given by:

$$\Omega(x)=[\Lambda(x)\cdot S(x)] \mod x^{2t} \qquad \text{Equation 15:}$$

Now we describe two example variant embodiments to the method of FIG. 2. For comparison, the method of FIG. 2 is referred to herein as VAR20.

In one alternative embodiment (referred to herein as VAR21), following operation 104 the KES first executes operations (112 and 128), (120 and 132) and (124 and 136), and then executes the three-way decision operation comprising operations COND1 108 and COND2 116, e.g., using a suitable multiplexer selection module. The output of the three-way decision (e.g., the multiplexer output) is provided to operation 140.

In another alternative embodiment (referred to herein as VAR22), in response to detecting that COND1 is false, the KES first executes operation 120 (or equivalently operation 124), and then executes operation COND2 116 to provide the output of operation 120 to one of operations 132 and 136, e.g., using a multiplexer module.

The method of FIG. 3 operates in a similar manner to the method of FIG. 2 described above. Specifically, both methods receive the same syndromes input, and evaluate the error locator polynomial $\Lambda(x)$ by executing a number of t iterations. In the description that follows we describe only the operations of the method of FIG. 3 that differ from parallel operations executed in the method of FIG. 2.

Error evaluation operation 204 of FIG. 3 is parallel to operation 104 of FIG. 2. Operation 204 differs from operation 104 by calculating the term $\lambda 1=\gamma\lambda-\delta b_{SR}$ explicitly, and deriving the second discrepancy by calculating $\delta 1=S(2i+1)\cdot\lambda 1$.

Updating operation 212 of FIG. 3 denoted UPDATE3 replaces operation 112 (UPDATE1) of FIG. 2. Similarly, operations 220 and 224 of FIG. 3 denoted UPDATE4 replace operations 120 and 124 (UPDATE2) of FIG. 2. Specifically, KES 40 executes operation 212 by calculating:

$$\lambda^* = \delta\lambda 1 - \delta 1 \lambda_{SR} \qquad \text{Equation 16:}$$

The KES further executes operations 220 and 224 by calculating:

$$\lambda^* = \gamma\lambda 1 - \delta 1 \lambda b_{SR2} \qquad \text{Equation 17:}$$

In addition, at operation 232, KES 40 updates b* to the value of λ1 that was explicitly calculated at operation 204.

The two variant embodiments described above with reference to the method of FIG. 2 are applicable to the method of FIG. 3 as well. For comparison, the method of FIG. 3 is referred to herein as VAR30. In one variant of FIG. 3 (referred to herein as VAR31) the KES executes operations (212 and 228), (220 and 232) and (224 and 236) before executing the tree-way decision of operations 208 and 216 (COND1 and COND2, respectively), which is implemented, for example by a multiplexer module. In another variant embodiment (referred to herein as VAR32), the KES executes operation 220 (or 224) before operation 216 (COND2) that provides the result of operation 220 to one of operations 232 and 236. In an embodiment, operation COND2 216 is implemented using a multiplexer module.

The methods described in FIG. 2 (VAR20) and its variant embodiments VAR21 and VAR22, as well as the methods described in FIG. 3 (VAR30) and its variant embodiments VAR31 and VAR32 are expected to perform similarly in terms of latency.

In the methods VAR20 and VAR21, the KES executes a large number of calculations in parallel, which relaxes the timing constraint for design, but typically requires additional hardware compared to the method of FIG. 3 (VAR30). The methods of VAR30 and VAR31 can employ modules that are typically used in conventional implementations, but typically require a timing constraint for the design that is tighter than required in the other variant methods. Implementing the methods of VAR22 and VAR32 typically requires smaller hardware footprint than required in the other variant embodiments.

The embodiments describe above are given by way of example, and other suitable embodiments can also be used. For example, although the embodiments described above refer mainly to RS codes, the disclosed techniques are applicable similarly to other block codes such as the Bose-Chaudhuri-Hocquenghem BCH code.

In the embodiments describe above the number (n−k) of redundancy symbols in the code word is assumed to be an even number. This assumption is not mandatory, and the disclosed techniques can be applied, mutatis mufandis, to RS codes in which the number of redundancy symbols is an odd number. In some embodiments, using an odd number for (n−k) requires processing an additional iteration.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A decoder, comprising:
   a syndrome calculator, configured to receive for decoding by the decoder an n-symbol code word that was encoded using a Reed Solomon (RS) code, and to calculate for the received code word a number of 2t syndromes $S_i$, i=0 ... 2t−1, wherein t=(n−k)/2 is a maximal number of erroneous symbols that the RS code is designed to correct, and (n−k) is a number of redundancy symbols in the code word;
   a Key Equation Solver (KES), configured to derive for the received code word an error locator polynomial $\Lambda$ (x) whose roots identify locations of erroneous symbols in the received code word, by applying to the syndromes a number of t iterations, wherein in a single iteration of the t iterations, the KES is configured to calculate first and second discrepancies between $\Lambda$ (x) and respective first and second candidates of $\Lambda$ (x), and to derive, from at least of the first and second candidates, an updated candidate of $\Lambda$ (x); and
   an error corrector, configured to recover an error-free version of the code word by correcting the erroneous symbols using the derived error locator polynomial $\Lambda$ (x).

2. The decoder according to claim 1, wherein the KES is configured to represent candidates of $\Lambda$ (x) using a coefficient vector λ, and to derive updated candidates of $\Lambda$ (x) by re-calculating λ a total number of t times over the t iterations.

3. The decoder according to claim 1, wherein the KES is configured to derive the updated candidate of $\Lambda$ (x) so that the first and second discrepancies calculated based on the updated candidate are eliminated.

4. The decoder according to claim 1, wherein the KES is configured to define, in an $i^{th}$ iteration, a first syndrome vector S(2i) and a second syndrome vector S(2i+1), wherein $S(i)=[S_i, S_{i-1}, \ldots, S_{i-t}]$, and to calculate the first and second discrepancies using the first and second syndrome vectors, respectively.

5. The decoder according to claim 4, wherein the KES is configured to calculate the first discrepancy as δ=S(2i)'λ and to calculate the second discrepancy as δ1=S(2i+1)'λ1, wherein λ and λ1 are coefficient vectors representing respective candidates of λ(x) corresponding to S(2i) and S(2i+1), respectively.

6. The decoder according to claim 4, wherein the KES is configured to calculate the first discrepancy as δ=S(2i)'λ, to calculate, in parallel the first discrepancy, first and second intermediate results δ11 and δ12, based at least on S(2i+1), and to calculate the second discrepancy using δ11 and δ12.

7. The decoder according to claim 1, wherein the KES is configured to store in each of the t iterations a shifted-by-one coefficient vector $b_{SR}$ and a shifted-by-two coefficient vector $b_{SR2}$ derived by shifting a coefficient vector corresponding to a candidate of $\Lambda$ (x) one position and two positions, respectively, and to derive an updated candidate of $\Lambda$ (x) in a subsequent iteration based at least on one of $b_{SR}$ and $b_{SR}$.

8. The decoder according to claim 1, wherein the KES comprises three updating modules available for deriving the updated candidate of $\Lambda$ (x), wherein the KES is configured to derive the updated candidate of $\Lambda$ (x) using one of the three updating modules.

9. The decoder according to claim 8, wherein the KES is configured to select one of the three updating modules using a three-way decision operation that depends on δ and δ1, and then to calculate the updated candidate of $\Lambda$ (x), using the selected updating module.

10. The decoder according to claim 8, wherein the KES is configured to calculate three candidates of $\Lambda$ (x) using the three updating modules, in parallel, and then to select one of the three candidates of $\Lambda$ (x) using a three-way decision operation that depends on δ and δ1.

11. The decoder according to claim 8, wherein the KES is configured to select one of the three updating modules in response to detecting that a first condition that depends on δ is true, and otherwise to calculate two updated candidates of $\Lambda$ (x) using remaining two updating modules, and selecting one of the two candidates of $\Lambda$ (x) by checking a second condition that depends on δ1.

12. A method for decoding, comprising:
    receiving for decoding by a decoder an n-symbol code word that was encoded using a Reed Solomon (RS) code;
    calculating for the received code word a number of 2t syndromes $S_i$, i=0 ... 2t−1, wherein t=(n−k)/2 is a maximal number of erroneous symbols that the RS code is designed to correct, and (n−k) is a number of redundancy symbols in the code word;
    deriving for the received code word, by a Key Equation Solver (KES), an error locator polynomial $\Lambda$ (x) whose roots identify locations of erroneous symbols in the received code word, by applying to the syndromes a number of t iterations, wherein in a single iteration of the t iterations, calculating by the KES first and second discrepancies between $\Lambda$ (x) and respective first and second candidates of $\Lambda$ (x), and deriving, from at least one of the first and second candidates, an updated candidate of $\Lambda$ (x); and
    recovering an error-free version of the code word by correcting the erroneous symbols using the derived error locator polynomial $\Lambda$ (x).

13. The method for decoding according to claim 12, comprising representing candidates of $\Lambda$ (x) using a coefficient vector λ, and deriving updated candidates of $\Lambda$ (x) by re-calculating λ a total number of t times over the t iterations.

14. The method for decoding according to claim 12, wherein deriving the updated candidate of $\Lambda$ (x) comprises c the updated candidate of $\Lambda$ (x) so that the first and second discrepancies calculated based on the updated candidate are eliminated.

15. The method for decoding according to claim 12, comprising defining, in an $i^{th}$ iteration, a first syndrome vector S(2i) and a second syndrome vector S(2i+1), wherein S(i)=[Si, Si−1, ... , Si−t], and wherein calculating the first and second discrepancies comprises evaluating the first and second discrepancies using the first and second syndrome vectors, respectively.

16. The method for decoding according to claim 15, wherein calculating the first and second discrepancies comprises calculating respective expressions δ=S(2i)'λ and δ1=S $(2i+1)'\lambda 1$, wherein $\lambda$ and $\lambda 1$ are coefficient vectors representing respective candidates of $\lambda(x)$ corresponding to $S(2i)$ and $S(2i+1)$, respectively.

17. The method for decoding according to claim 15, wherein calculating the first discrepancy comprises calculating $\delta$ as $\delta=S(2i)'\lambda$, further calculating, in parallel to the first discrepancy, first and second intermediate results $\delta 11$ and $\delta 12$, based at least on $S(2i+1)$, and wherein calculating the second discrepancy comprises calculating $\delta 1$ using $\delta 11$ and $\delta 12$.

18. The method for decoding according claim 12, comprising storing in each of the t iterations a shifted-by-one coefficient vector bSR and a shifted-by-two coefficient vector bSR2 derived by shifting a coefficient vector corresponding to a candidate of $\Lambda(x)$ one position and two positions, respectively, and deriving an updated candidate of $\Lambda(x)$ in a subsequent iteration based at least on one of bSR and bSR2.

19. The method for decoding according to claim 12, wherein the KES comprises three updating modules available for deriving the updated candidate of $\Lambda(x)$, wherein deriving the updated candidate of $\Lambda(x)$ comprises calculating the updated candidate of $\Lambda(x)$ using one of the three updating modules.

20. The method for decoding according to claim 19, wherein calculating the updated candidate of $\Lambda(x)$ comprises selecting one of the three updating modules using a three-way decision operation that depends on $\delta$ and $\delta 1$, and then calculating the updated candidate of $\Lambda(x)$, using the selected updating module.

* * * * *